United States Patent
Lee et al.

(10) Patent No.: US 9,257,296 B2
(45) Date of Patent: Feb. 9, 2016

(54) ETCH PROCESS WITH PRE-ETCH TRANSIENT CONDITIONING

(71) Applicant: Lam Research Corporation, Fremont, CA (US)

(72) Inventors: Wonchul Lee, San Ramon, CA (US); Qian Fu, Pleasanton, CA (US); John S. Drewery, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/845,188

(22) Filed: Sep. 3, 2015

(65) Prior Publication Data

US 2015/0380264 A1    Dec. 31, 2015

Related U.S. Application Data

(63) Continuation of application No. 13/715,973, filed on Dec. 14, 2012, now Pat. No. 9,142,417.

(51) Int. Cl.
*H01L 21/467* (2006.01)
*H01L 21/3065* (2006.01)

(52) U.S. Cl.
CPC ............................. *H01L 21/30655* (2013.01)

(58) Field of Classification Search
None
See application file for complete search history.

(56) References Cited

U.S. PATENT DOCUMENTS

| | | |
|---|---|---|
| 7,141,504 B1 | 11/2006 | Bhardwaj |
| 7,303,999 B1 | 12/2007 | Sriraman et al. |
| 2005/0287815 A1 | 12/2005 | Lai et al. |
| 2007/0199922 A1 | 8/2007 | Shen et al. |
| 2008/0286978 A1 | 11/2008 | Chen et al. |
| 2009/0286400 A1 | 11/2009 | Heo et al. |
| 2011/0027999 A1 | 2/2011 | Sparks et al. |
| 2014/0167228 A1 | 6/2014 | Lee et al. |

OTHER PUBLICATIONS

Office Action dated May 8, 2014 from U.S. Appl. No. 13/715,973.
Final Office Action dated Aug. 29, 2014 from U.S. Appl. No. 13/715,973.
Office Action dated Dec. 4, 2014 from U.S. Appl. No. 13/715,973.
Final Office Action dated Apr. 3, 2015 from U.S. Appl. No. 13/715,973.
Notice of Allowance dated May 21, 2015 from U.S. Appl. No. 13/715,973.

*Primary Examiner* — Robert Bachner
*Assistant Examiner* — Molly Reida
(74) *Attorney, Agent, or Firm* — Beyer Law Group LLP

(57) ABSTRACT

A method for etching features with different aspect ratios in an etch layer is provided. A plurality of cycles is provided wherein each cycle comprises a pre-etch transient conditioning of the etch layer, which provides a transient condition of the etch layer, wherein the transient condition has a duration and etching the etch layer for a duration, wherein the duration of the etching with respect to the duration of the transient condition is controlled to control etch aspect ratio dependence.

12 Claims, 6 Drawing Sheets

ETCH PROCESS WITH PRE-ETCH TRANSIENT CONDITIONING

CROSS REFERENCE TO RELATED APPLICATIONS

This application is a continuation of pending U.S. application Ser. No. 13/715,973, filed on Dec. 14, 2012 and entitled "ETCH PROCESS WITH PRE-ETCH TRANSIENT CONDITIONING," which is incorporated herein by reference in its entirety for all purposes.

BACKGROUND OF THE INVENTION

The present invention relates to the formation of semiconductor devices. More specifically, the invention relates to the formation of semiconductor devices require etching features of different aspect ratios.

During semiconductor wafer processing, sometimes features of widely different widths are etched into an etch wafer. As the features are etched, the different widths cause aspect ratio dependent etching, which causes the features of different aspect ratios to etch at different rates. Such aspect ratio dependent etching may cause detrimental results.

SUMMARY OF THE INVENTION

To achieve the foregoing and in accordance with the purpose of the present invention, a method for etching features with different aspect ratios in an etch layer is provided. A plurality of cycles is provided wherein each cycle comprises a pre-etch transient conditioning of the etch layer, which provides a transient condition of the etch layer, wherein the transient condition has a duration and etching the etch layer for a duration, wherein the duration of the etching with respect to the duration of the transient condition is controlled to control etch aspect ratio dependence.

In another manifestation of the invention, a semiconductor device formed by the method for etching features with different aspect ratios in an etch layer. A plurality of cycles is provided, wherein each cycle comprises a pre-etch transient conditioning of the etch layer, which provides a transient condition of the etch layer, wherein the transient condition has a duration and etching the etch layer for a duration, wherein the duration of the etching with respect to the duration of the transient condition is controlled to control etch aspect ratio dependence.

In another manifestation of the invention, an apparatus is provided. A plasma processing chamber is provided, comprising a chamber wall forming a plasma processing chamber enclosure, a substrate support for supporting a wafer within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. At least one RF power source is electrically connected to the at least one electrode. A gas source is in fluid connection with the gas inlet. A controller is controllably connected to the gas source and the at least one RF power source and comprises at least one processor and computer readable media. The computer readable media comprises computer readable code for providing a plurality of cycles, wherein each cycle comprises computer readable code for a pre-etch transient conditioning of the etch layer, which provides a transient condition of the etch layer, wherein the transient condition has a duration; and computer readable code for etching the etch layer for a duration, wherein the duration of the etching with respect to the duration of the transient condition is controlled to control etch aspect ratio dependence.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
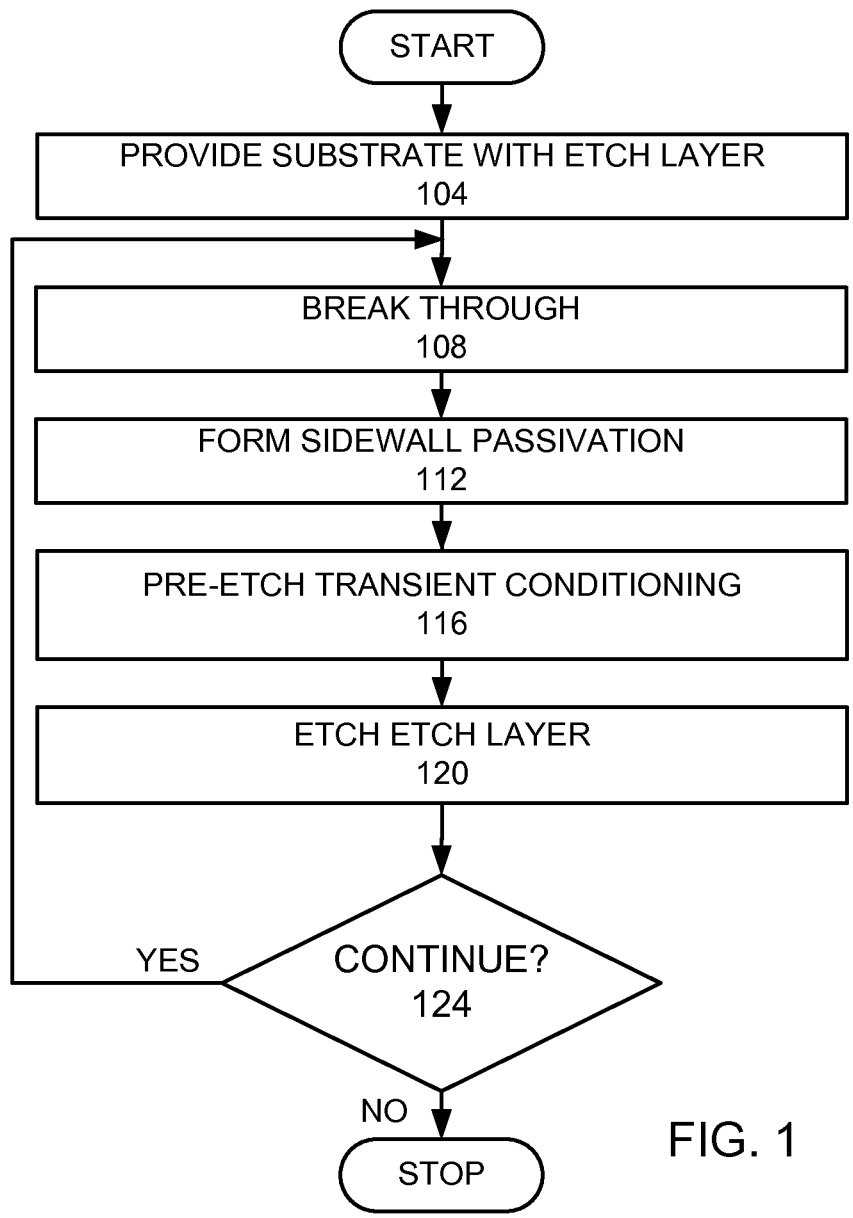
FIG. 1 is a high level flow chart of a process that may be used in an embodiment of the invention.

To facilitate understanding, FIG. 1 is a high level flow chart of a process that may be used in an embodiment of the invention, which etches features of different aspect ratios. A substrate is provided with an etch layer (step 104). A cyclical process for etching is then provided for a plurality of steps, with each cycle comprising a break through and sidewall passivation forming step (step 108), a pre-etch transient conditioning (step 116), and an etch step for etching the etch layer (step 120). The cycles are repeated (step 124) until the plurality of cycles are completed and the process is stopped.

EXAMPLE

Figure 2A:
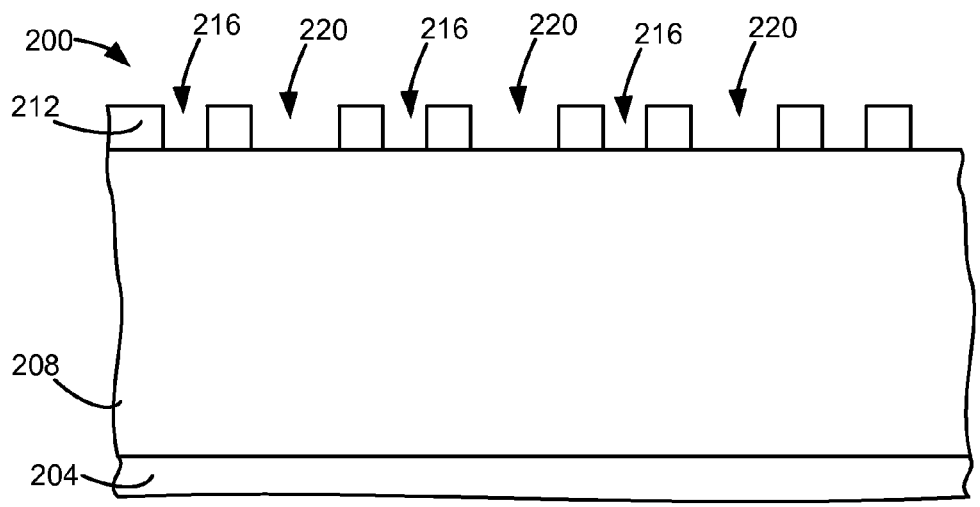
FIGS. 2A-C are schematic cross-sectional views of a stack processed according to an embodiment of the invention.

In an example of an implementation of the invention, a substrate is provided with an etch layer under a mask with wider and narrower features (step 104). FIG. 2A is a cross sectional view of a stack 200 with a substrate 204 disposed below an etch layer 208, disposed below a patterned mask 212 with narrower features 216 and wider features 220. In this example, the etch layer 208 is silicon, which may either be polysilicon, deposited crystalline silicon, or an upper layer of a silicon wafer, which also forms the substrate 204. The patterned mask is formed from silicon oxide in this example. In various embodiments, one or more layers may be placed between the various layers. For example, one or more layers, such as an etch stop layer, may be between the etch layer 208 and the substrate 204.

Figure 3:
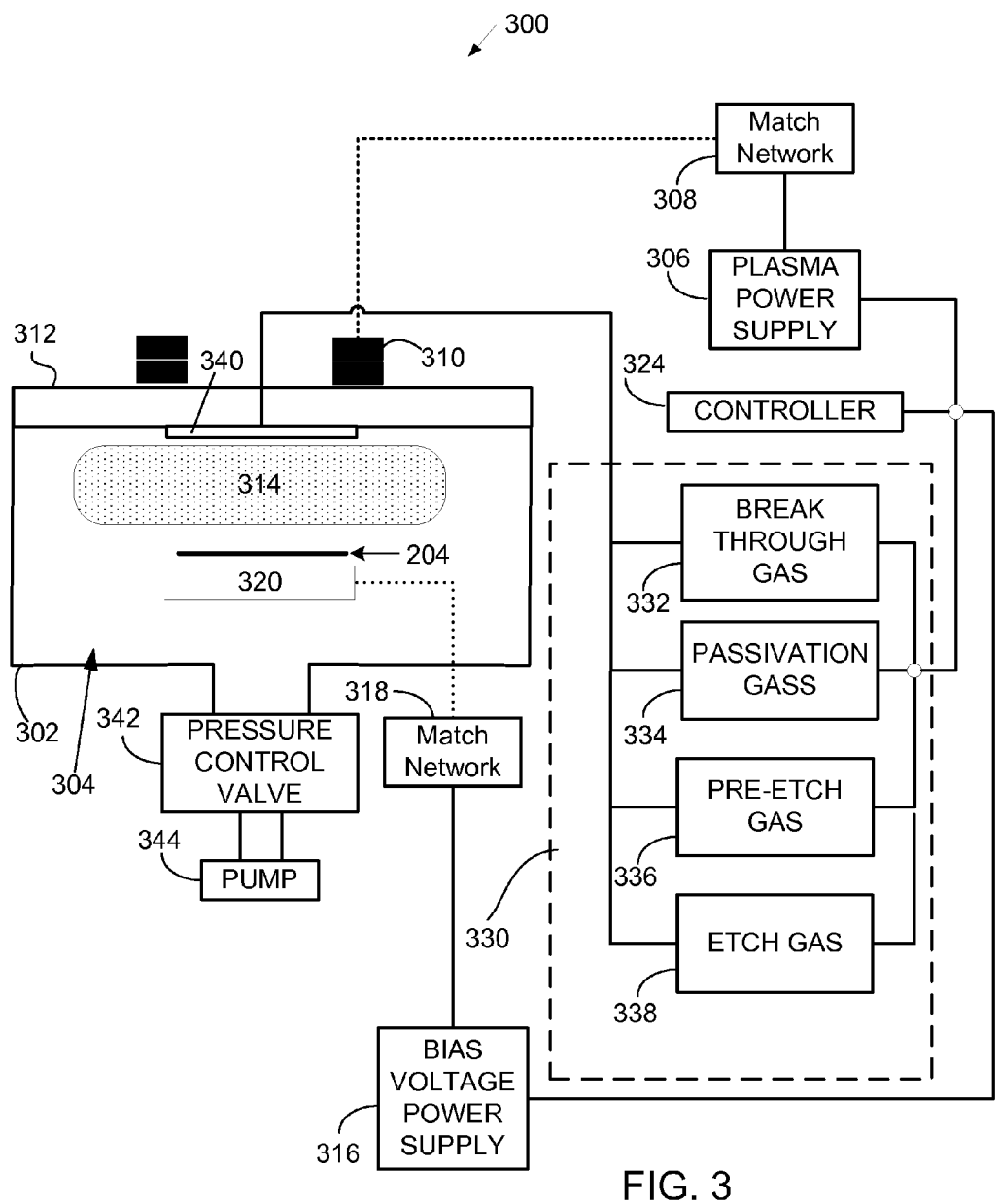
FIG. 3 is a schematic view of a plasma processing chamber that may be used in practicing the invention.

The substrate 204 is placed in a plasma processing system to perform subsequent steps. FIG. 3 schematically illustrates an example of a plasma processing system 300 which may be used to perform the process of etching silicon wafers in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 204 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a break through gas source 332, a passivation gas source 334, as pre-etch transient conditioning gas source 336, and an etch gas source 338. The break through gas may have some of the same components as the passivation gas, the pre-etch transient conditioning gas, or etch gas. In such a case, instead of having a separate gas source, the gas source provides various components of the break through gas, passivation gas, pre-etch transient conditioning gas, and etch gas, as will be described below. The gas sources 332, 334, 336, and 338 are in fluid connection with plasma processing chamber 304 through a gas inlet, such as a shower head 340. The gas inlet may be located in any advantageous location in the plasma processing chamber 304, and may take any form for injecting gas. Preferably, however, the gas inlet may be configured to produce a "tunable" gas injection profile, which allows independent adjustment of the respective flow of the gases to multiple zones in the plasma process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. may be used to practice an embodiment of the invention.

Figure 4:
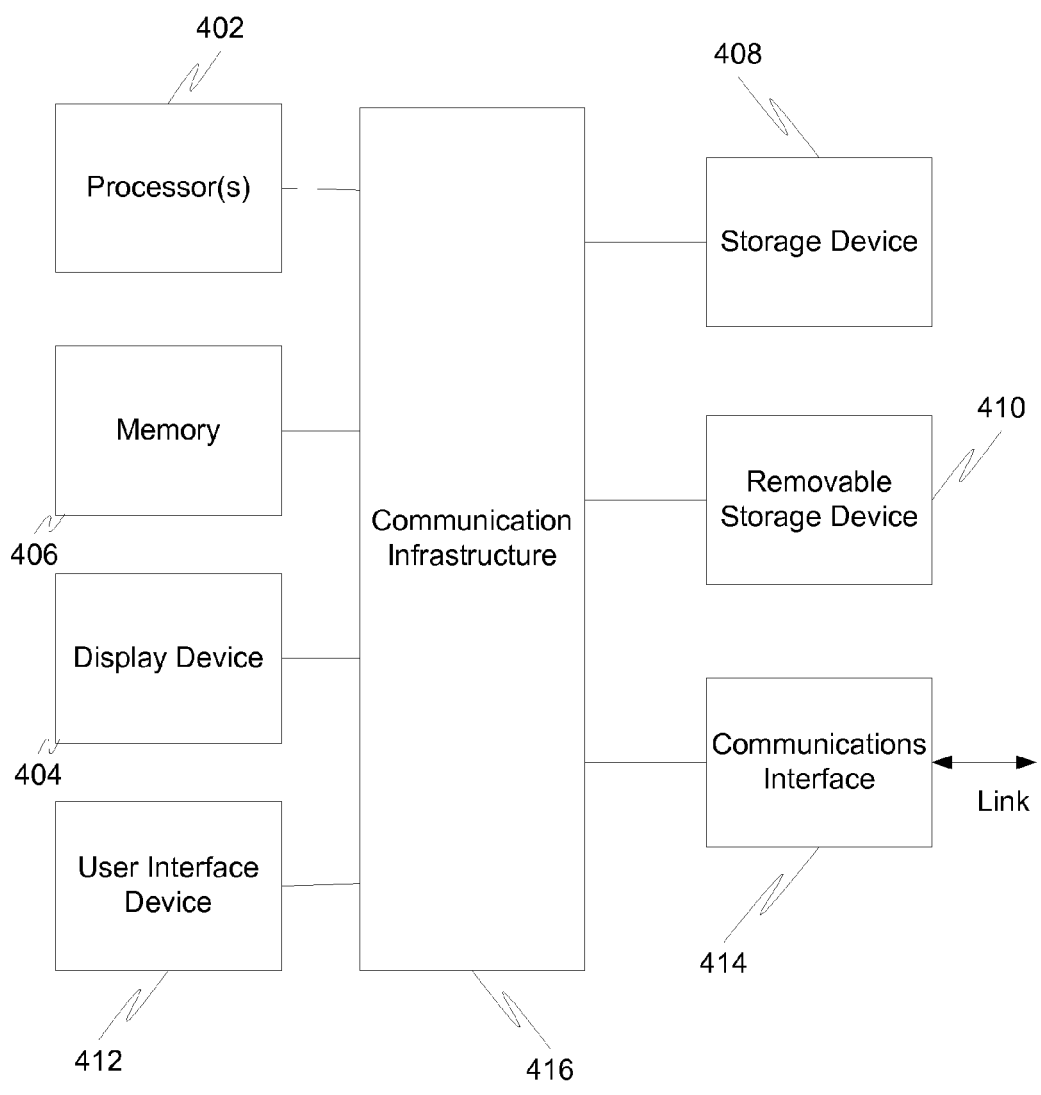
FIG. 4 illustrates a computer system, which is suitable for implementing a controller used in embodiments of the present invention.

FIG. 4 is a high level block diagram showing a computer system 400, which is suitable for implementing a controller 324 used in embodiments of the present invention. The computer system may have many physical forms ranging from an integrated circuit, a printed circuit board, and a small hand-held device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The cyclical etch process is begun. A break through and sidewall passivation formation step is performed (step 108). In this example, 50-2000 watts at 13.6 MHz of RF power are provided by the TCP coil 310. A bias of 100-1000 volts is provided by the lower electrode 320. The chamber pressure is set at a pressure between 1 to 100 mtorr. The wafer temperature is maintained at a temperature between 0°-120° C. A break through gas of 25-500 sccm $CF_4$ is provided from the gas source 330 into the plasma processing chamber 304. The RF power forms the break through gas into a plasma, which is maintained for 3-20 seconds. The pressure may be changed within the range of 1 to 100 mtorr. 50-2000 watts of RF power is provided at 13.6 MHz provided by the TCP coil 310. A bias of less than 300 volts is provided. The wafer temperature is maintained between 0-120° C. A passivation gas of between 50-1000 sccm $O_2$ is provided from the gas source 330 into the plasma processing chamber 304 and formed into a plasma. The plasma is maintained for 3-60 seconds.

A pre-etch transient conditioning provides a transient conditioning (step 116). In this example, the pressure may be changed within the range of 1 to 100 mtorr. 50-2000 watts of RF power is provided at 13.6 MHz provided by the TCP coil 310. A bias of less than 300 volts is provided. The wafer temperature is maintained between 0°-120° C. A pre-etch transient conditioning gas of between 50-2000 sccm of He and 0-2000 sccm $O_2$ is provided from the gas source 330 into the plasma processing chamber 304. The RF power forms the pre-etch transient conditioning gas into a plasma, which is maintained for 1-10 seconds.

The etch layer is etched (step 120). In this example, the pressure may be changed within the range of 1 to 100 mtorr. 50-2000 watts of RF power is provided at 13.6 MHz provided by the TCP coil 310. A bias of between 100-1500 volt is provided by the lower electrode 320. The wafer temperature is maintained between 0-120° C. An etch gas of 50-1000 sccm $Cl_2$ is provided from the gas source 330 into the plasma processing chamber 304. The RF power forms the etch gas into a plasma, which is maintained for 2-30 seconds.

Figure 2B:
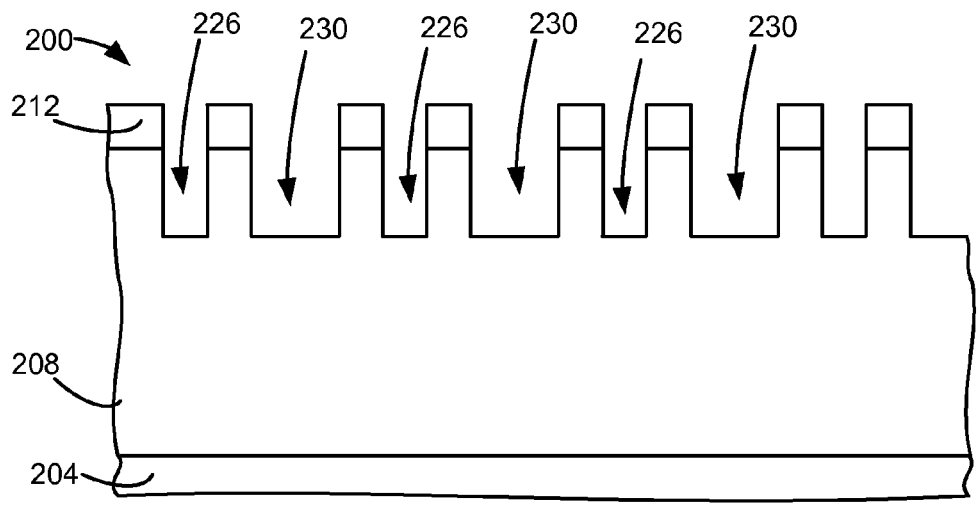

FIG. 2B is a cross-sectional view of the stack 200 after one or more cycles, where features are partially etched. The etching provides narrower features 226 and wider features 230. In this embodiment, the depths of the narrower features 226 are about the same as the depths of the wider features 230.

Figure 2C:
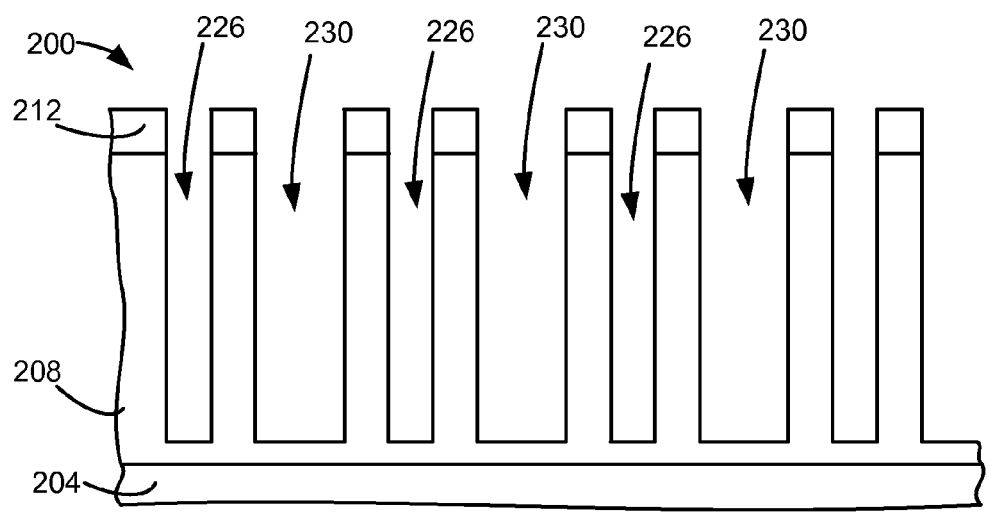

The cycles are continued until a desired etch depth is reached. FIG. 2C is a cross-sectional view of the stack 200 after the cyclical etch is completed. In this embodiment, the depths of the narrower features 226 are about the same as the depths of the wider features 230. It has been unexpectedly found that the pre-etch transient conditioning allows for etching where aspect ratio dependence is reduced or eliminated.

Figure 5:
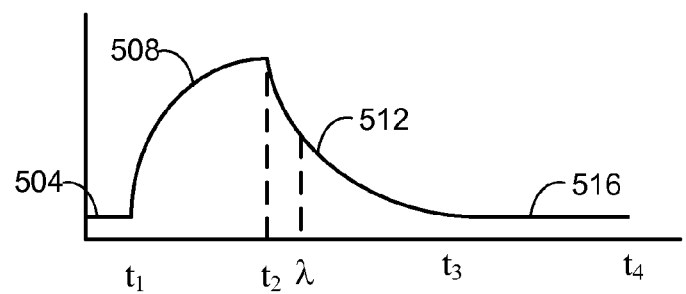
FIG. 5 is a graph of the conditioning provided by the pre-etch transient conditioning.

FIG. 5 is a graph of a conditioning of the etch layer with respect to aspect ratio dependent etching. The straight line 504 prior to $t_1$ shows that during the forming the sidewall passivation (step 108) the conditioning does not change. The pre-etch transient conditioning step (step 116) causes the increase in conditioning between $t_1$ and $t_2$ 508. Such conditioning may make the etch layer reverse aspect ratio dependent. Once the pre-etch transient conditioning stops, the transient conditioning of the etch layer degrades 512 so that there is a half-life X, which is the duration from when the conditioning stops to when half of the conditioning is lost. The conditioning is completely lost at time $t_3$, shown by the flat profile 516. So, the transient conditioning duration is the difference between the time when the conditioning is stopped $t_2$ and the time when the transient conditioning is lost $t_3$. In this embodiment, the duration of the etch is longer than the half life and the transient conditioning duration. In addition, the relationship of the duration of the etch to the half-life of the conditioning or the transient conditioning duration is used to control aspect ratio dependence.

Figure 6:
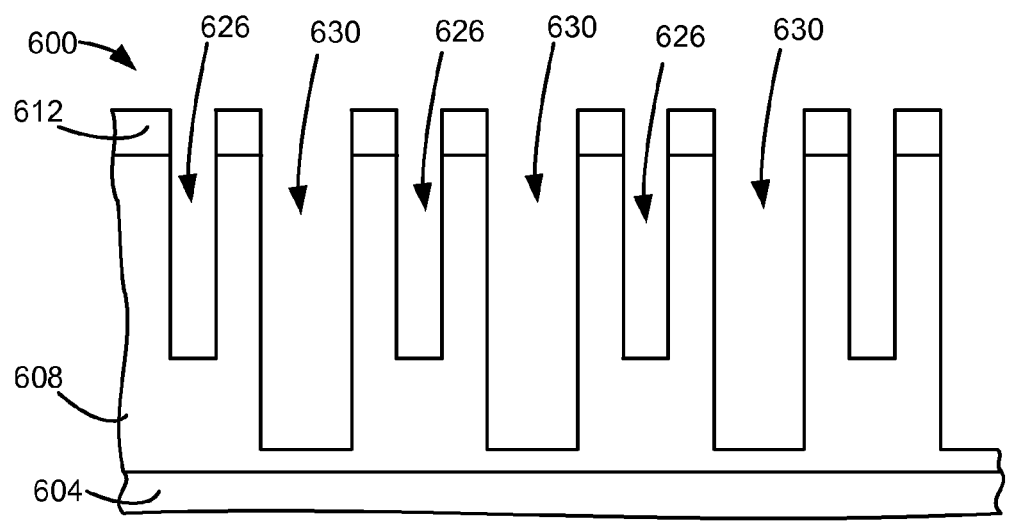
FIG. 6 is a schematic cross-sectional view of a stack processed according to the prior art.

FIG. 6 is a schematic view of a stack 600 that is etched without the pre-etch transient conditioning. The stack 600 comprises a substrate 604 disposed below an etch layer 608, disposed below a patterned mask 612. The prior art process etches narrower features 626 and wider features 630, where the wider features are etched further than the narrower features due to aspect ratio dependent etching (ARDE).

In reverse ARDE, narrower features are etched faster than wider features. Embodiments of the invention use a relationship between a half life or the duration of a pre-etch transient conditioning and a duration of an etch as an ARDE control.

While in some embodiments, the pre-etch transient conditioning gas is a mixture of He and $O_2$, more generally the pre-etch transient conditioning gas comprises He. In some embodiments the pre-etch transient conditioning gas consists essentially of He. Preferably, the pre-etch transient conditioning gas comprises He and $O_2$. Preferably, the pre-etch transient conditioning gas does not have an etch component.

Preferably, the pre-etch transient conditioning does not etch and has a low bias. Preferably, the bias is less than 300 volts. More preferably, the bias is less than 20 volts. Most preferably, there is no bias. Preferably, the pre-etch transient conditioning has a duration of less than 10 seconds. More preferably the pre-etch transient conditioning has a duration of less than 3 seconds. Preferably, the pre-etch transient conditioning has a half-life of less than 3 seconds. Because the transient conditioning is lost within 50 seconds, the transition from the pre-etch transient conditioning to the etching is performed without extinguishing the plasma, providing a continuous plasma. Although a continuous plasma shows better performance than discontinuous plasma, an embodiment of the invention improves processes with a discontinuous plasma. In order to quickly perform a plurality of cycles, preferably the transition between all the steps within the cycle is accomplished without extinguishing the plasma. Although the plasma is continuous, preferably each step is performed sequentially and not simultaneously. However, some embodiments may allow some overlap between steps, where preferably each step has a period where only one particular gas, such as the etch gas, break through gas, passivation gas, or pre-etch transient conditioning gas is exclusively provided.

In some embodiments, the duration of the etch cycle is less than the duration of the transient conditioning. In other embodiments, the duration of the etch cycle is approximately equal to the half-life of the pre-etch transient conditioning, which would be a fraction of the duration of the transient conditioning.

Preferably, the etch layer is a silicon, such as polysilicon or crystalline silicon. More preferably, the etch layer is polysilicon. More generally, the etch layer is a silicon containing layer, such as silicon oxide or silicon nitride. More generally, the etch layer may be other dielectric or conductive materials.

The pre-etch transient conditioning was unexpectedly found to reduce ARDE. Without being bound by theory, it is believed that the pre-etch transient conditioning does not provide a deposition or passivation, since the pre-etch transient conditioning gas may consist of pure He, and He is not believed to provide a deposition or passivation. Since the pre-etch transient conditioning lasts only a few seconds, a cyclical process is needed to repeat the pre-etch transient conditioning and the etching.

Preferably, the features have a space CD of less than 30 nm. More preferably, the features have a space CD of less than 20 nm. Preferably, the features have a depth of at least 100 nm. More preferably, the features have a depth of at least 200 nm. Preferably, the wider features have a width at least 2 times the width of the narrower features. More preferably, the wider features have a width at least 4 times the width of the narrower features.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features with different aspect ratios in an etch layer, comprising:

a plurality of cycles, wherein each cycle comprises:
- a pre-etch transient conditioning of the etch layer, which provides a transient condition of the etch layer, wherein the transient condition has a duration, wherein the pre-etch transient conditioning comprises
  - providing a pre-etch transient conditioning gas consisting essentially of He and $O_2$; and
  - forming the pre-etch transient conditioning gas into a plasma; and
- etching the etch layer for a duration, wherein the duration of the etching with respect to the duration of the transient condition is controlled to control etch aspect ratio dependence, wherein the etching follows the pre-etch transient conditioning, wherein the etching taking place within the duration of the transient condition provides a lower aspect ratio dependent etch than etching past the duration of the transient condition.

2. The method, as recited in claim 1, wherein the pre-etch transient conditioning does not etch.

3. The method, as recited in claim 2, wherein the plurality of cycles further comprise a break through step and sidewall passivation formation step after the break through step.

4. The method, as recited in claim 3, wherein the etch layer is a silicon layer.

5. The method, as recited in claim 4, wherein a continuous plasma is provided from the pre-etching transient conditioning and the etching.

6. The method, as recited in claim 5, wherein the continuous plasma is provided for a plurality of cycles.

7. The method, as recited in claim 1, wherein the plurality of cycles further comprise a break through step and sidewall passivation formation step after the break through step.

8. The method, as recited in claim 1, wherein the etch layer is a silicon layer.

9. The method, as recited in claim 8, wherein the silicon layer is polysilicon or crystalline silicon.

10. The method, as recited in claim 1, wherein a continuous plasma is provided from the pre-etching transient conditioning and the etching.

11. The method, as recited in claim 10, wherein the continuous plasma is provided for a plurality of cycles.

12. The method as recited in claim 1, wherein the transient condition has a half-life, and wherein the duration of the etching is at least as long as the half-life.

* * * * *